United States Patent [19]
Naso et al.

[11] Patent Number: 5,168,174
[45] Date of Patent: Dec. 1, 1992

[54] NEGATIVE-VOLTAGE CHARGE PUMP WITH FEEDBACK CONTROL

[75] Inventors: Giovanni Naso; Giovanni Santin, both of Houston, Tex.; Sebastiano D'Arrigo, Cannes, France

[73] Assignee: Texas Instruments Incorporated, Dallas, Tex.

[21] Appl. No.: 729,105

[22] Filed: Jul. 12, 1991

[51] Int. Cl.[5] ................................. G05F 3/16
[52] U.S. Cl. .............................. 307/296.6; 307/296.1; 307/296.2
[58] Field of Search ................ 307/296.1, 296.2, 296.6

[56] References Cited

U.S. PATENT DOCUMENTS

| | | | |
|---|---|---|---|
| 4,388,537 | 6/1983 | Kanuma | 307/296.6 |
| 4,439,692 | 3/1984 | Beckmans et al. | 307/296.2 |
| 4,471,290 | 9/1984 | Yamaguchi | 307/296.6 |
| 4,488,060 | 12/1984 | Simko | 307/548 |
| 4,825,142 | 4/1989 | Wang | 307/296.2 |
| 4,843,256 | 6/1989 | Scade et al. | 307/296.2 |
| 5,039,877 | 8/1991 | Chern | 307/296.2 |
| 5,057,707 | 10/1991 | Pigott | 307/296.6 |

Primary Examiner—Janice A. Howell
Assistant Examiner—Scott A. Ouellette
Attorney, Agent, or Firm—Theodore D. Lindgren; Leo N. Heiting; Richard L. Donaldson

[57] ABSTRACT

A charge-pump circuit implements ramp control, steady-state regulation and trimming of the negative voltage pulses. The circuit includes a negative-voltage charge-pump subcircuit having multiple phase inputs, a phase-enable input, an output, a supply voltage, a reference voltage, a ramp-control subcircuit for controlling the rate of change of the voltage at the output of charge-pump subcircuit, and an amplitude-control subcircuit for controlling the amplitude of the voltage at the output of the charge-pump subcircuit. The ramp-control has an input coupled to the output of the charge-pump subcircuit and an output coupled to the phase-enable input of the charge-pump subcircuit. The amplitude-control subcircuit has an input to the output of the charge-pump subcircuit and has an output coupled to the phase-enable input of the charge-pump subcircuit.

8 Claims, 4 Drawing Sheets

NEGATIVE-VOLTAGE CHARGE PUMP WITH FEEDBACK CONTROL

BACKGROUND OF THE INVENTION

This invention relates to a semiconductor memory devices and more particularly to an improved negative-voltage charge pump for integrated circuits, including electrically-erasable, electrically-programmable, read-only-memories (EEPROMs).

An EEPROM memory cell typically comprises a floating-gate field-effect transistor. The floating-gate of a programmed memory cell is charged with electrons, and the electrons in turn render the source-drain path under the charged floating gate nonconductive when a predetermined voltage is applied to the control gate. The nonconductive state is read by a sense amplifier as a "zero" bit. The floating-gate of a nonprogrammed cell is neutrally charged (or slightly positively or negatively charged) such that the source-drain path under the non-programmed floating gate is conductive when the predetermined voltage is applied to the control gate. The conductive state is read by a sense amplifier as a "one" bit.

Each column and row of an EEPROM array may contain thousands of floating-gate memory cells. The sources of each cell in a column are connected to a source-column line and the source-column line for a selected cell may be connected to reference potential or ground during reading of the selected cell by a sense amplifier The drains of each cell in a column are connected to a separate bitline (drain-column line) and the drain-column line for a selected cell is connected to the input of the sense amplifier during reading of the selected cell. The control gates of each cell in a row are connected to a row line, and the row line for a selected cell is connected to the predetermined select voltage during reading of the selected cell.

Circuits for generating negative voltage pulses by means of a charge-pump circuit are well-known and are used in commercially available flash EEPROMs, such as part number T29F256 manufactured and sold by Texas Instruments Incorporated. The negative-voltage charge-pump circuits used in that EEPROM are open-loop configurations in which the shape of the negative output voltage pulses is not controlled, either during the initial slope or during the final steady-state value.

A problem resulting from the open-loop circuit configurations has been that the output voltage wave-form varies considerably with the load connected to the output of the charge-pump. The output voltage is, for example, affected by phenomena including body effect and breakdown of dielectric material, both of which vary according to the particular process used to fabricate each batch of integrated circuits. In the case of nonvolatile memories having both chip-erase and block-erase capability, the load varies greatly depending upon which erase option is used. Therefore, there is a need for a circuit to provide closed-loop control of the initial slope and the final steady-state value of negative voltage pulses generated by a charge-pump circuit.

SUMMARY OF THE INVENTION

The circuit of this invention implements ramp control, steady-state regulation and trimming of the negative voltage pulses. The circuit includes a negative-voltage charge-pump subcircuit having multiple phase inputs, a phase-enable input, an output, a supply voltage, a reference voltage, a ramp-control subcircuit for controlling the rate of change of the voltage at the output of charge-pump subcircuit, and an amplitude-control subcircuit for controlling the amplitude of the voltage at the output of the charge-pump subcircuit. The ramp-control subcircuit has an input coupled to the output of the charge-pump subcircuit and an output coupled to the phase-enable input of the charge-pump subcircuit. The amplitude-control subcircuit has an input to the output of the charge-pump subcircuit and has an output coupled to the phase-enable input of the charge-pump subcircuit.

DETAILED DESCRIPTION OF A SPECIFIC EMBODIMENT

Figure 1:
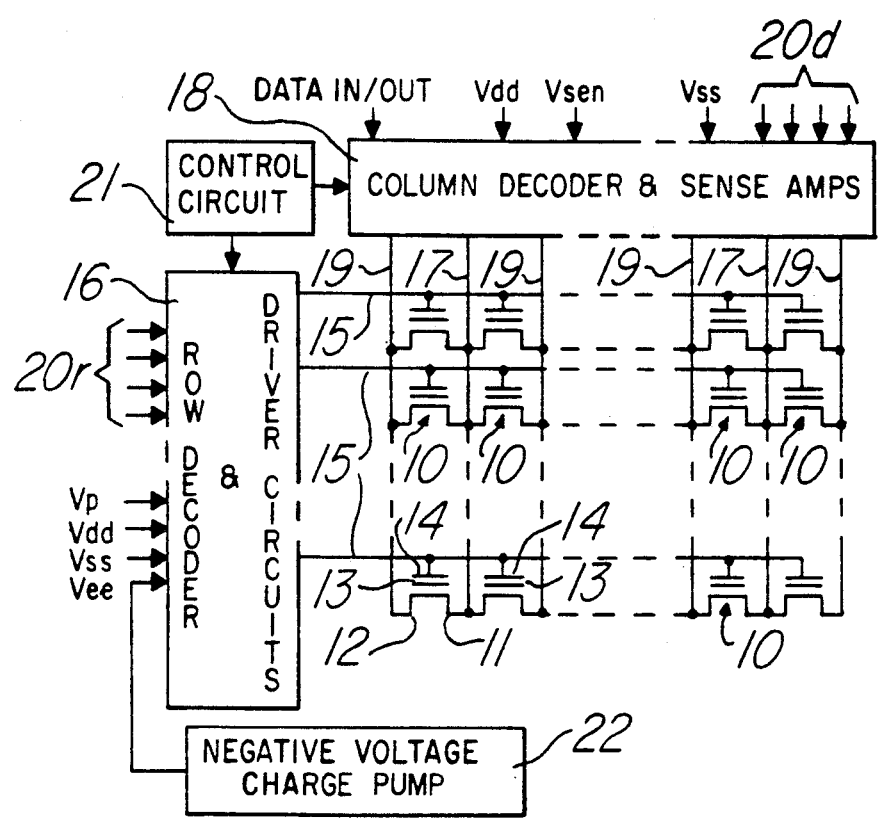
FIG. 1 is a representation of an array of nonvolatile memory cells and associated circuitry.

Referring to FIG. 1, an example array of EEPROM memory cells, which is an integral part of a memory chip, is shown for the purpose of illustrating this invention. Each EEPROM cell is a floating-gate transistor 10 having a source 11, a drain 12, a floating gate 13 and a control gate 14. Each of the control gates 14 in a row of cells 10 is connected to a row line 15, and each of the row lines 15 is connected to a row decoder 16, which includes row driver circuits. Each of the sources 11 in a column of cells 10 is connected to a source-column line 17, and each of the source-column lines 17 is connected to a column decoder 18, which includes at least one sense amplifier circuit. Each of the drains 12 in a column of cells 10 is connected to a drain-column line (bitline) 19, and each of the bitlines 19 is connected to the column decoder 18.

In a write or program mode, the row decoder 16 may function, in response to row-line address signals on lines 20r and to a signal from control circuit 21, to place a preselected first programming voltage Vp (approx. +16 to +18 volts) on a selected row line 15, including a selected control-gate 14. Control circuit 21 may include a microprocessor separate from the memory chip. Column decoder 18, in response to signals on lines 20d and to a signal from control circuit 21, may function to place a preselected second programming voltage (reference potential Vss or ground, or a non-positive voltage) on selected source-column line 17, which includes a selected source region 11. The preselected second programming voltage Vss must differ sufficiently from the first preselected programming voltage Vp that excess electrons will migrate, perhaps by Fowler-Nordheim tunnelling, to the selected floating-gate 13 and, as a result, program that selected floating-gate 13. Column decoder 18 and row decoder 16 may optionally, in response to signals on lines 20d and 20r and in response to a signal from control circuit 21, place voltages of about +7 volts on deselected source-column lines 17 and/or on deselected row lines 15 to prevent a disturb of the programmed status of deselected cells 10. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During erase mode of operation, the column decoder 18 may, for example, function to apply a positive voltage Vdd (approx. +5 volts) to the selected source-column line 17. The column decoder 18 may also, for example, function to leave at least the selected drain-column line 19 floating. The row decoder 16 may, for example, function to apply a high negative voltage Vee (approx. −11 volts) to the selected row line 15. The applied voltages function to remove excess electrons from the floating gate 13 of the a selected programmed cell 10.

In the read mode, the row decoder 16 functions, in response to row-line address signals on lines 20r and to a signal from control circuit 21, to apply a preselected positive voltage (approx. +3 to +5 volts) to the selected row line 15 (and the selected control gate 14), and to apply a low voltage (ground or Vss) to deselected row lines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell 10 connected to the selected drain-column line 19 and the selected row line 15 is detected by a sense amplifier, which supplies data to the DATA IN/OUT terminal.

As is well-known, the source 11 regions and the drain 12 regions of the memory cells 10 may be interchanged for the various modes of operation. For example, Fowler-Nordheim tunnelling for programming and/or erasing may take place between a drain 12 region and a floating-gate 13, or between a source 11 region and a floating-gate 13. Voltages applied to the source 11 and drain 12 regions in the read example above are interchangeable. Therefore, the terms "source" and "drain" as used herein are considered interchangeable for each mode of operation.

For convenience, a table of read, write and erase voltages is given in the TABLE I below:

TABLE I

|  | Read | Write | Erase |
| --- | --- | --- | --- |
| Selected Row Line | 3-5 V | 16-18 V | −11 V |
| Deselected Row Lines | 0 V | 7 V |  |
| Selected Source Line | 0 V | 0 V | 5 V |
| Deselected Source Lines | Float | 7 V |  |

TABLE I-continued

|  | Read | Write | Erase |
| --- | --- | --- | --- |
| Drain Lines | 1-1.5 V | Float | Float |

Figure 2:
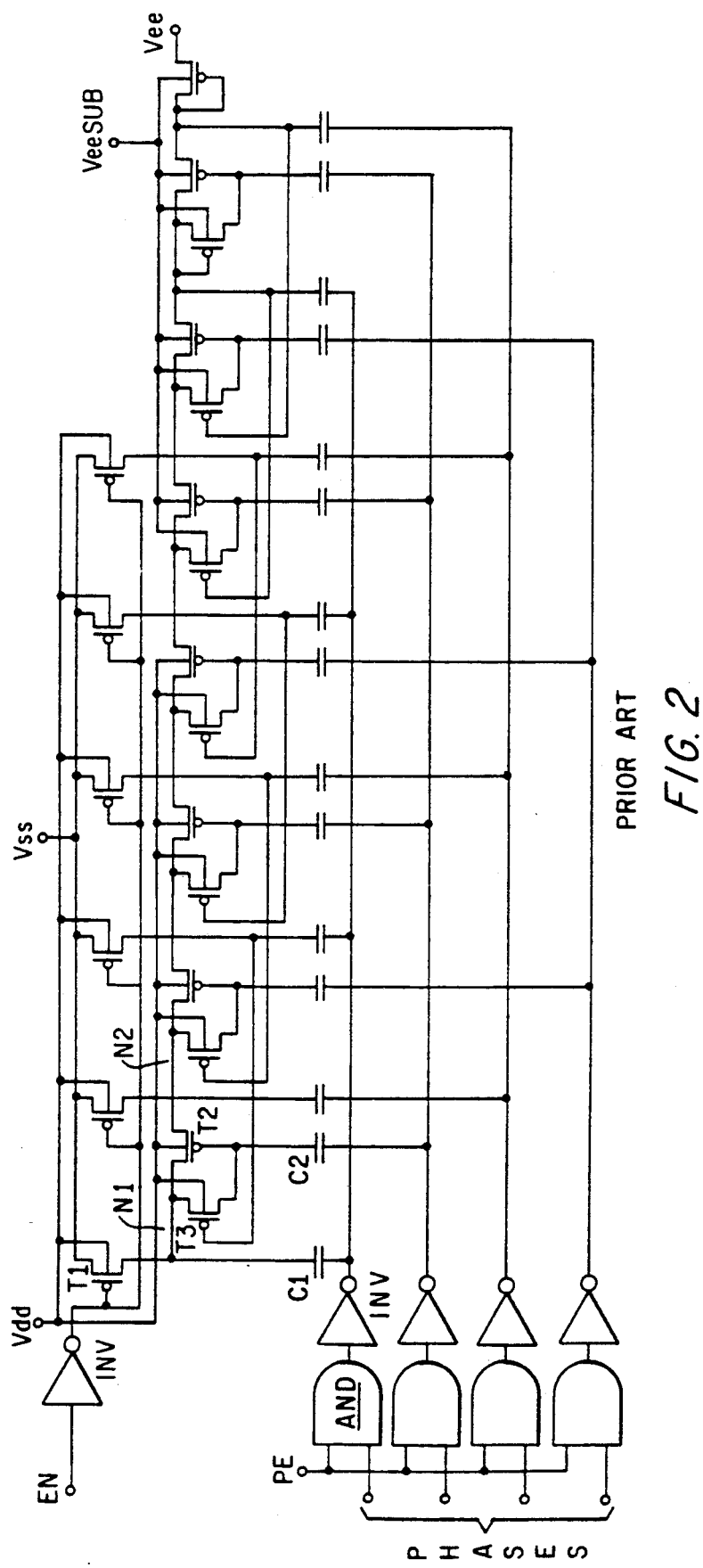
FIG. 2 is a schematic of a prior-art open-loop negative charge pump circuit.

Referring to FIG. 2, a prior-art, open-loop, negative-voltage CHARGE PUMP circuit is illustrated. When the CHARGE PUMP circuit of FIG. 2 is disabled, signal EN and PE are forced low. Nodes N1 and N2 are floating and the PHASES signals cannot excite various stages of the charge pump because the AND gates are off. When the CHARGE PUMP circuit is enabled, transistor T1 is on and nodes N1 and N2 are initialized to 0 volts. The PHASES signals go through the AND gates to the terminals of capacitors C1 and C2. The PHASES signals are such that during the first half of the period node N1 is charged to a higher level than node N2 (transistor T1 is forced to be off) and in the second half of the period negative charges are transferred from node N1 to node N2 via the diode formed by transistors T3 and T2. Negative charges are transferred through the various stages until a negative high voltage (−11 to −16 volts) is reached at terminal Vee. The substrate of the last stages (VeeSUB) is switched from Vdd to 0 volts when nodes are negative, thus decreasing the body effect of the last stages.

Figure 3:
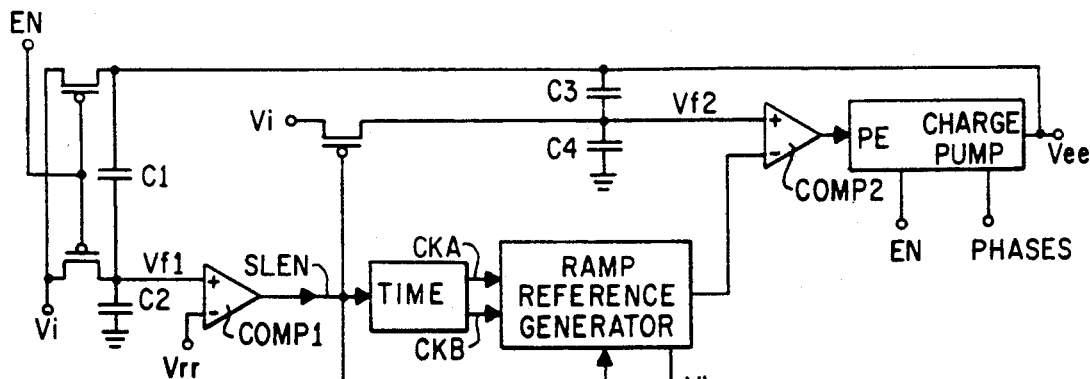
FIG. 3 is a schematic representation, in partial block form, of a circuit for providing ramp control for the negative-voltage charge pump of FIG. 2.

Referring to FIG. 3, a circuit for providing ramp control of the negative voltage generated by a CHARGE PUMP circuit of FIG. 2 is illustrated. In FIG. 3, the block designated CHARGE PUMP is a negative-voltage generator such as that of FIG. 2, using a charge-transfer mechanism synchronized by signals applied to the PHASES input terminal. The CHARGE PUMP circuit is enabled by signals applied to the EN (Block-Enable) and PE (Phase-Enable) terminals.

When the CHARGE PUMP circuit is disabled (the signal applied to terminal EN is low), the output voltage Vee is not negative. Instead, the output voltage Vee is forced to a constant reference positive voltage Vi (the initialization voltage).

When the CHARGE PUMP circuit is enabled (the signal applied to the EN is high), the CHARGE PUMP circuit starts to function and the output voltage Vee decreases from initialization voltage Vi to a range of negative values.

A voltage Vfl, which is a fraction of the difference between the output voltage Vee and the positive initialization voltage Vi, is detected by the capacitor voltage divider (C1,C2). The fractional voltage Vfl is equal to Vi+(Vee−Vi)C1/(C1+C2+Cin), where Cin is the input capacitance of the comparator designated COMP1. The fractional voltage Vfl is compared by comparator COMP1 with a constant ramp reference positive voltage Vrr, where ramp reference voltage Vrr is less than initialization voltage Vi. When fractional voltage Vfl is less than or equal to the ramp reference voltage Vrr, the initial point (corner) of the ramp is detected and a controlled ramp is then generated.

The ramp-control circuit includes a RAMP REFERENCE GENERATOR circuit and a second comparator COMP2.

Figure 4:
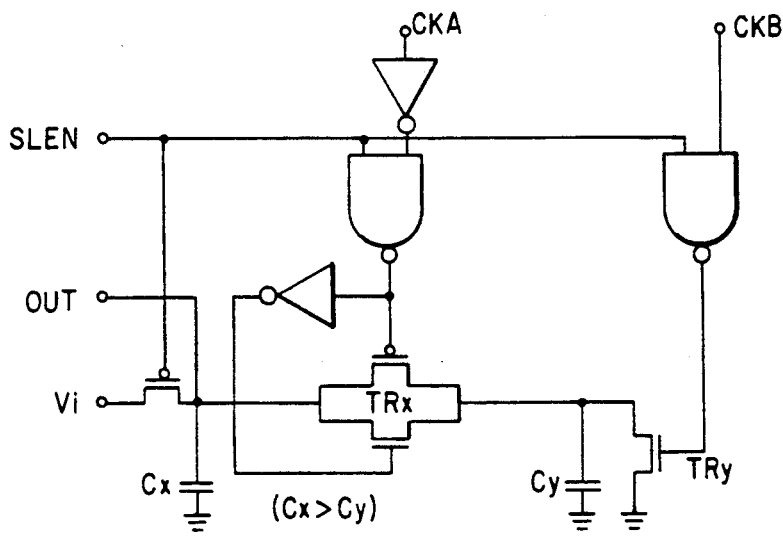
FIG. 4 is a schematic representation of the ramp-reference generator of the circuit schematic of FIG. 3.

An embodiment of the RAMP REFERENCE GENERATOR circuit of FIG. 3 is shown in FIG. 4.

Figure 5:
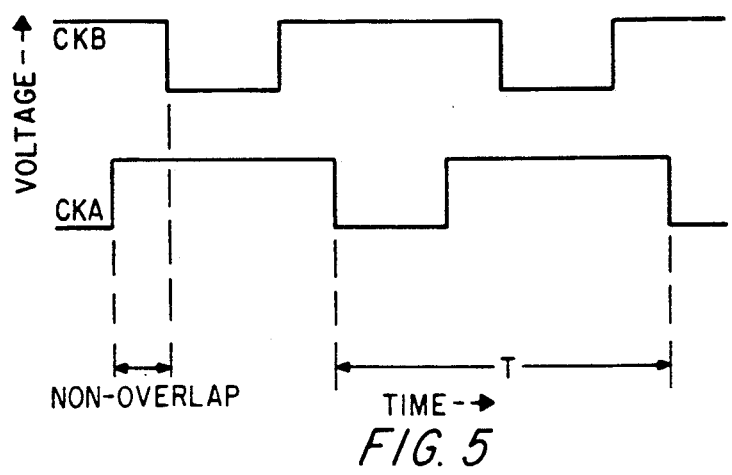
FIG. 5 is a representation of the timing signals used with the circuit schematic of FIG. 4.

Signals at terminals CKA and CKB are generated by a timer. The signals are shown in FIG. 5. Signals CKA and CKB are generated by the timer and vary from 0 volts to Vdd in amplitude. The signals begin when a corner is detected (the signal at SLEN is equal to Vdd). The signals are non-overlapped in the sense that when CKB is 0 volts (transistor TRy of FIG. 4 is on) and when CKA is at Vdd volts (transistors TRx of FIG. 4 are off), thus avoiding discharge of transistor Cx of FIG. 4 to ground.

Referring again to FIG. 4, the operation of the ramp-control circuit is described. During periods in which the ramp-control circuit is disabled, the capacitor Cx is charged to the positive value of initialization voltage Vi. When the ramp-control circuit is enabled by the signal at terminal SLEN, a part of the charge on capacitor Cx is transferred to capacitor Cy via transistor TRx, then discharged to ground via transistor TRy. The output signal at the terminal OUT is a wave-form decreasing from the initialization voltage Vi to zero volts with an exponential shape that is nearly linear during the initial stage. Referring again to FIG. 3, the comparator (COMP2) of the rampcontrol circuit compares voltage Vf2 to the varying output of the RAMP REFERENCE GENERATOR. Voltage Vf2 is related to Vee and is equal to $Vi+(Vee-Vi)C3/(C3+C4+Cin)$.

Based on the comparison of voltage Vf2 and output of the RAMP REFERENCE GENERATOR, the signal at the output terminal OUT will, or will not, allow transfer of charges into the CHARGE PUMP circuit from signals applied to the PHASES input terminal.

Figure 6:
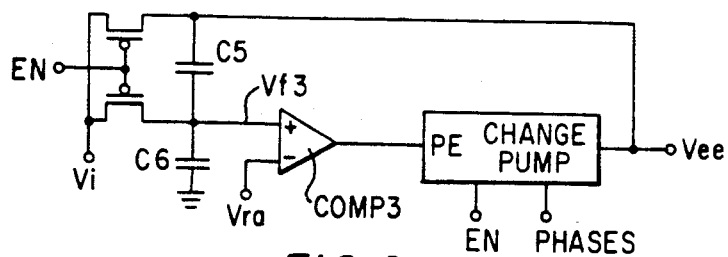
FIG. 6 is a schematic representation, in partial block form, of a circuit for regulating the output amplitude of the negative-voltage charge pump of FIG. 2.

Referring to FIG. 6, an example circuit for regulating the amplitude of a negative voltage generated by a charge-pump circuit is illustrated.

When the CHARGE PUMP circuit of FIG. 6 is enabled by the signal at terminal EN (the voltage at terminal EN is high), the CHARGE PUMP circuit starts to operate and the output voltage Vee decreases to negative values. The changing value of output voltage Vee is detected via output voltage Vf3 of a capacitor voltage divider (C5,C6). The output voltage Vf3 of the capacitor voltage divider is equal to $Vi+(Vee-Vi)C5/(C5+C6+Cin)$, where Cin is the input capacitance of comparator COMP3.

Voltage Vf3 is compared to a constant positive amplitude reference voltage Vra by comparator COMP3. The comparison starts with the positive initial value of initialization voltage Vi and continues to the positive amplitude reference value Vra. Based on the result of that comparison, the output signal of comparator COMP3 will or will not allow the transfer of charges into the CHARGE PUMP circuit from signals applied to the PHASES input terminal, forcing Vee to the constant value $Vi+(Vra-Vi)(C5+C6+Cin)/C5$.

Figure 7:
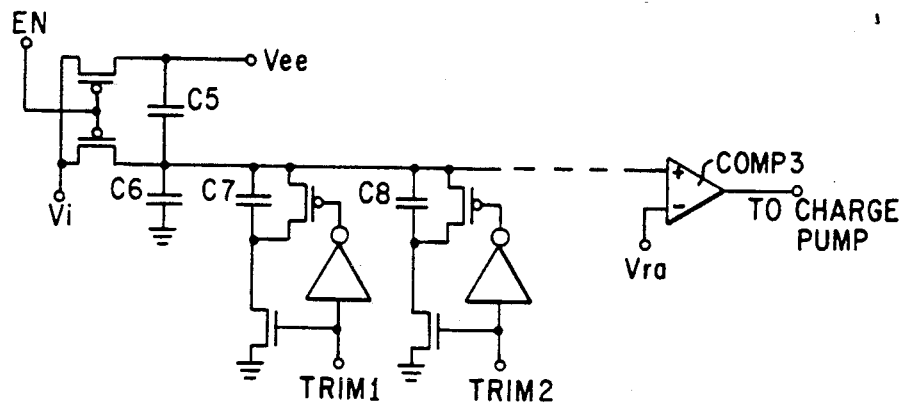
FIG. 7 is a schematic representation, in partial block form, of the circuit of FIG. 6 with added components for trimming the output amplitude of a negative-voltage charge pump.

The example circuit of FIG. 7 may be used to trim the constant or steady-state value of Vee.

A value of zero volts applied to signal terminals TRIM1, TRIM2, . . . causes capacitors C7, C8, . . . to be disconnected from the capacitor voltage divider. By controlling the number of capacitors C7, C8, . . . connected to the capacitor voltage divider circuit, the final or steady-state value of Vee is controlled to a desired level.

Figure 8:
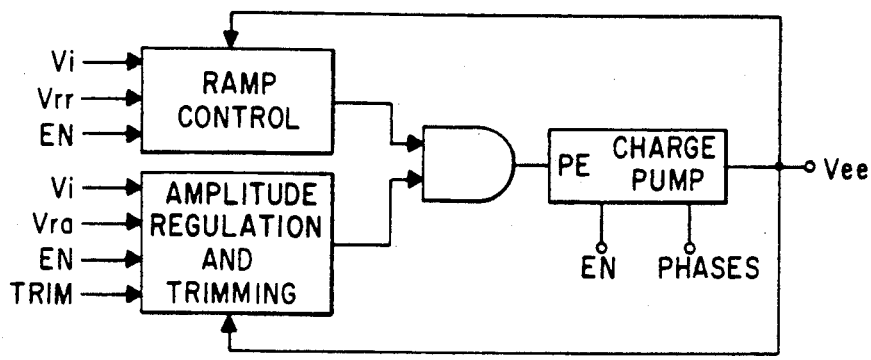
FIG. 8 is a schematic representation, in block form, of a circuit combining the features of the circuits of FIG. 3 and either FIG. 6 or FIG. 7.

An example circuit combining ramp control, amplitude regulation, and trimming is shown in FIG. 8.

Figure 9:
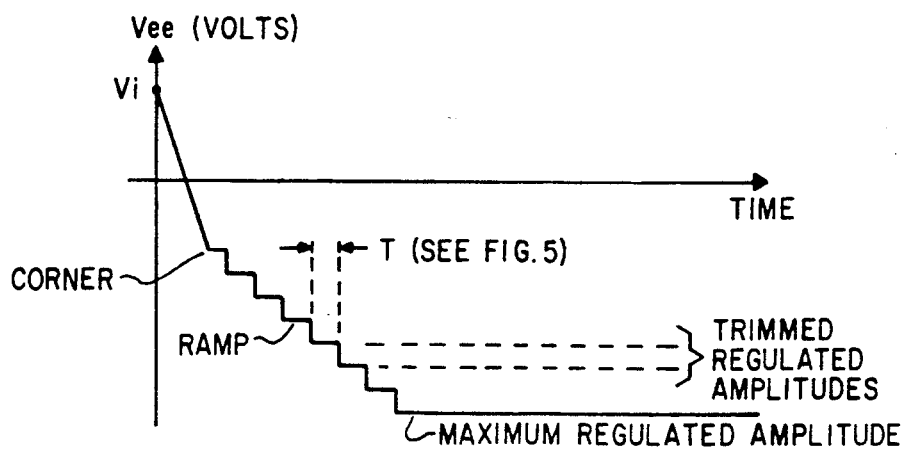
FIG. 9 illustrates the output of the charge-pump circuit of FIG. 8, for example.

The resulting wave-form for Vee is shown in FIG. 9.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A negative-voltage charge-pump circuit having a charge-pump subcircuit including multiple phase inputs, a phase-enable input, an output voltage, a supply voltage and a reference voltage, said circuit comprising:
   a ramp-control means for controlling the rate of change of said output voltage of said charge-pump subcircuit, said ramp-control means having an input and an output, said input of said ramp-control means coupled to said output of said charge-pump subcircuit, said output of said ramp-control means coupled to said phase-enable input of said charge-pump subcircuit.

2. The charge-pump circuit of claim 1, wherein said ramp-control means includes at lest one capacitance voltage divider circuit for sensing the voltage at said output of said charge-pump subcircuit.

3. The charge-pump circuit of claim 1, said ramp-control means including a ramp reference generator with clocked inputs, an initial voltage input, an enabling input and an output; wherein said enabling input of said ramp reference generator is riggered by a comparison between a first fraction of said output of said charge-pump subcircuit and a ramp reference voltage, and wherein phase enable input of said charge pump subcircuit is triggered by a comparison of said output of said ramp reference genertor nd a second fraction of said output of said charge-pump subcircuit.

4. The charge-pump circuit of claim 1, said ramp-control means including a ramp reference generator with clocked inputs, an initial voltage inputs, an enabling input and an output; wherein said enabling input of said ramp reference generator is triggered by a comparison between a first fraction of said output of said charge-pump subcircuit and a ramp reference voltage; wherein phase enable input of said charge pump subcircuit si triggered by a comparison of said output of said ramp reference generator and a second fraction of said output of said charge-pump subcircuit; wherein said ramp reference generator includes at least one capacitor connected between said output of said ramp reference generator and said reference voltage; and wherein said capacitor is discharged in response to a signal on said enabling input of said ramp reference generator.

5. A negative-voltage charge-pump circuit having a charge pump subcircuit including multiple phase inputs, a phase-enable input, an output voltage, a supply voltage and a reference voltage, comprising:
   an multitude-control means for controlling the amplitude of said output voltage of said charge-pump subcircuit, said amplitude-control means having an input and an output, said input of said amplitude-control means coupled to said output of said charge-pump subcircuit, said output of said amplitude-control means coupled to said phase-enable input of said charge-pump subcircuit.

6. The charge-pump circuit of claim 5, wherein said amplitude-control means includes a capacitance voltage divider circuit for sensing the voltage at said output of said charge-pump subcircuit.

7. The charge-pump circuit of claim 5, wherein said amplitude control means includes an amplitude reference input voltage and wherein said phase-enable input of said charge-pump subcircuit is triggered by a comparison of said amplitude reference input voltage nd a fraction of the voltage at said output of said charge-pump subcircuit.

8. The charge-pump circuit of claim 5, wherein said amplitude-control means includes trim voltage inputs, includes a capacitance voltage divider circuit for sensing the voltage at said output of said charge-pump subcircuit and wherein the ratio of said capacitance voltage is adjustable by applying said trim voltage inputs to connect and disconnect capacitors in parallel with a capacitor of said capacitor voltage divider.

* * * * *